(12) United States Patent
Chen et al.

(10) Patent No.: US 10,043,932 B2
(45) Date of Patent: Aug. 7, 2018

(54) INTERNALLY-HEATED THERMAL AND EXTERNALLY-COOL PHOTOVOLTAIC CASCADE SOLAR ENERGY SYSTEM FOR FULL SOLAR SPECTRUM UTILIZATION

(71) Applicant: Massachusetts Institute of Technology, Cambridge, MA (US)

(72) Inventors: Gang Chen, Carlisle, MA (US); Evelyn N. Wang, Cambridge, MA (US); Svetlana V. Boriskina, Winchester, MA (US); Kenneth McEnaney, Cornish, NH (US); Hadi Ghasemi, Boston, MA (US); Selcuk Yerci, Brighton, MA (US); Andrej Lenert, Cambridge, MA (US); Sungwoo Yang, Somerville, MA (US); Nenad Miljkovic, Cambridge, MA (US); Lee A. Weinstein, Somerville, MA (US); David Bierman, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 427 days.

(21) Appl. No.: 14/464,103

(22) Filed: Aug. 20, 2014

(65) Prior Publication Data
US 2015/0053266 A1     Feb. 26, 2015

Related U.S. Application Data

(60) Provisional application No. 61/868,715, filed on Aug. 22, 2013, provisional application No. 61/935,005, (Continued)

(51) Int. Cl.
*H01L 31/052* (2014.01)
*H02S 40/44* (2014.01)
(Continued)

(52) U.S. Cl.
CPC .............. *H01L 31/052* (2013.01); *F24J 2/07* (2013.01); *F24J 2/085* (2013.01); *F24J 2/245* (2013.01);
(Continued)

(58) Field of Classification Search
CPC ............ H01L 31/052; H02S 40/44; F24J 2/07
(Continued)

(56) References Cited

U.S. PATENT DOCUMENTS

| | | | |
|---|---|---|---|
| 4,215,673 A | 8/1980 | Cohen | 126/419 |
| 4,262,657 A | 4/1981 | McCullough et al. | 126/436 |

(Continued)

FOREIGN PATENT DOCUMENTS

| | | | |
|---|---|---|---|
| CN | 201 532 028 | 7/2010 | F24J 2/00 |
| CN | 201532028 U * | 7/2010 | F24J 2/268 |

(Continued)

OTHER PUBLICATIONS

Specac, "Spectroscopic Wavelength and Frequency Ranges", Specac, [online], [retrieved on Jan. 12, 2017]. Retrieved from the Internet<URL: http://www.specac.com/userfiles/file/SpectroscopicRanges.pdf>, pp. 1-2.*

(Continued)

*Primary Examiner* — Tae-Sik Kang
(74) *Attorney, Agent, or Firm* — Sunstein Kann Murphy & Timbers LLP

(57) ABSTRACT

A single-stack, solar power receiver comprising both a thermal absorber layer and a photovoltaic cell layer. The stack includes an aerogel layer, that is optically transparent and thermally insulating ("OTTI"); a spectrally selective high thermal conductivity ("SSTC") thermal absorber layer; a bottom OTTI layer; and a PV cell layer. The SSTC layer includes a set of fins that substantially blocks solar radiation absorption in the band where PV cells are most sensitive.

(Continued)

Photons with energies above or below this band block range are absorbed by the fins and the absorbed heat is conducted to pipes in the fin structure carrying a heated thermal working fluid to heat storage. Photons with energy in the band block range are reflected by the SSTC fins to the PV cell layer. The bottom OTTI aerogel layer keeps the PV cell operating near ambient temperature. The PV cell converts incident solar radiation to electrical energy.

20 Claims, 6 Drawing Sheets

Related U.S. Application Data filed on Feb. 3, 2014, provisional application No. 62/014,768, filed on Jun. 20, 2014.

(51) Int. Cl.
| | |
|---|---|
| *F24J 2/07* | (2006.01) |
| *F24J 2/08* | (2006.01) |
| *F24J 2/24* | (2006.01) |
| *F24J 2/48* | (2006.01) |
| *F24J 2/50* | (2006.01) |
| *F24J 2/54* | (2006.01) |

(52) U.S. Cl.
CPC ............... *F24J 2/485* (2013.01); *F24J 2/505* (2013.01); *F24J 2/541* (2013.01); *H02S 40/44* (2014.12); *F24J 2002/508* (2013.01); *Y02E 10/41* (2013.01); *Y02E 10/43* (2013.01); *Y02E 10/44* (2013.01); *Y02E 10/47* (2013.01)

(58) Field of Classification Search
USPC .......................................................... 136/259
See application file for complete search history.

(56) References Cited

U.S. PATENT DOCUMENTS

| | | | | |
|---|---|---|---|---|
| 5,685,152 A | * | 11/1997 | Sterling | .................. B60R 16/03 60/641.15 |
| 2009/0288705 A1 | | 11/2009 | Hiwatashi et al. | ........... 136/256 |
| 2012/0273026 A1 | * | 11/2012 | Chatterjee | ............... H02S 40/44 136/248 |

FOREIGN PATENT DOCUMENTS

| | | | | |
|---|---|---|---|---|
| DE | | 39 23 821 | 1/1991 | .................. F24J 2/04 |
| DE | | 3923821 A1 | * 1/1991 | .................. F24J 2/26 |
| EP | | 2 608 278 | 6/2013 | ........... H01L 31/052 |
| WO | | WO 2004079278 A1 | * 9/2004 | ......... C03C 17/3417 |

OTHER PUBLICATIONS

International Searching Authority, International Search Report—International Application No. PCT/US2014/051872, dated Nov. 24, 2014, together with the Written Opinion of the International Searching Authority, 11 pages.

* cited by examiner

INTERNALLY-HEATED THERMAL AND EXTERNALLY-COOL PHOTOVOLTAIC CASCADE SOLAR ENERGY SYSTEM FOR FULL SOLAR SPECTRUM UTILIZATION

CROSS-REFERENCE TO RELATED APPLICATIONS

This patent application claims priority to U.S. Provisional Patent Application No. 61/868,715, filed Aug. 22, 2013, entitled "Internally-Heated Thermal and Externally-Cool Photovoltaic Cascade Solar System for the Full Solar Spectrum Utilization." This patent application also claims priority to U.S. Provisional Patent Application No. 61/935,005, filed Feb. 3, 2014, also entitled "Internally-Heated Thermal and Externally-Cool Photovoltaic Cascade Solar System for the Full Solar Spectrum Utilization." This patent application also claims priority to U.S. Provisional Patent Application No. 62/014,768, filed Jun. 20, 2014, also entitled "Internally-Heated Thermal and Externally-Cool Photovoltaic Cascade Solar System for the Full Solar Spectrum Utilization." Each of these three provisional patent applications is incorporated by reference herein in their entirety.

STATEMENT REGARDING FEDERALLY SPONSORED RESEARCH OR DEVELOPMENT

This invention was made with Government support under Grant Nos. DE-SC0001299, DE-FG02-09ER46577, and DE-EE0005320 awarded by the Department of Energy. The Government has certain rights in the invention.

TECHNICAL FIELD

The present invention relates to solar energy systems and, more particularly, to combination photovoltaic ("PV") and concentrating solar power ("CSP") systems.

BACKGROUND ART

The development of high-efficiency dispatchable solar energy conversion systems is critical to increase solar penetration into the energy market. Two well-developed technologies—photovoltaic ("PV") power and concentrating solar power ("CSP")—have advanced solar energy conversion in two different directions: while PV is cheaper and more efficient than CSP, CSP has the dispatchability that is required if solar energy is ever to replace traditional base load generation.

SUMMARY OF THE EMBODIMENTS

In a first embodiment of the invention, there is provided a single-stack solar power receiver. The receiver stack comprises in order: an optical concentrator; a first aerogel layer that is optically transparent and thermally insulating ("OTTI"); a heat absorption layer that is spectrally selective with high thermal conductivity; a second OTTI aerogel layer and a photovoltaic cell layer.

In various embodiments of the invention, the heat absorption layer includes metal fins. The fins may be made from or coated with a band-block material that decreases solar radiation absorption by the fins in the band where the PV cells are most sensitive. Solar radiation in this band is reflected by the fins and passes through the second aerogel layer to the PV cell layer. The heat absorption layer further includes pipes connected to the fins with these pipes carrying a thermal working fluid. Solar energy absorbed by the fins is thermally conducted to the thermal working fluid in the pipes. Working fluid heated by the pipes can be transferred to external heat storage devices or converters connected to the pipes. Solar energy reflected to the PV cell is transformed into electricity.

In specific embodiments of the invention, the fins may be connected in various ways including as a set of parallel fins, a grid of fins and a honeycomb of fins. The fins may be coated with a band-block filter comprising a composite film made of multiple layers of dielectrics and possibly also metals.

BRIEF DESCRIPTION OF THE DRAWINGS

The foregoing features of embodiments will be more readily understood by reference to the following detailed description, taken with reference to the accompanying drawings, in which:

FIGS. 3A-B show a parallel fin structure for the spectrally selective high thermal conductivity ("SSTC") thermal absorber layer of the embodiment of FIG. 1, while

DETAILED DESCRIPTION OF SPECIFIC EMBODIMENTS

In various embodiments of the present invention, a solar power receiver is provided comprising a single stack. This stack includes both a thermal absorber layer and a PV cell layer. The stack includes from top to bottom: a top layer, that is optically transparent and thermally insulating ("OTTI"); a spectrally selective, high thermal conductivity ("SSTC") thermal absorber layer in which a working fluid is heated; a bottom OTTI layer; and a PV cell layer. Solar radiation is incident on the top of the stack. The top OTTI layer serves to reduce the radiation and convection losses from the internally hot region SSTC layer to the ambient. The SSTC absorber layer includes a set of metallic fins coated with a film that substantially blocks solar radiation absorption in the band where PV cells of the type chosen for a particular embodiment of the invention are most sensitive (i.e., in the limited frequency range just above the frequency corresponding to the electronic bandgap of the PV cell material). Photons with energies above or below this band block range are absorbed by the SSTC's fins and the absorbed heat is conducted to pipes in the fin structure. These pipes carry a heated thermal working fluid, to transfer heat energy to a heat storage or conversion device external to the receiver stack. Photons with energy in the band block range are reflected by the SSTC fins to the subsequent lower stack layers, i.e., the bottom OTTI and the PV layers. The bottom OTTI aerogel layer keeps the PV cell operating near ambient temperature and passes the non-absorbed solar radiation reflected by the fins to the PV cell. The PV cell converts incident solar radiation to electrical energy for transfer out of the receiver stack. As opposed to conventional approaches that place a PV layer on top of a thermal absorption layer, the splitting of the solar spectrum by the SSTC minimizes thermalization losses in the PV cell, helping to avoid excessive PV cell heating.

Figure 1:
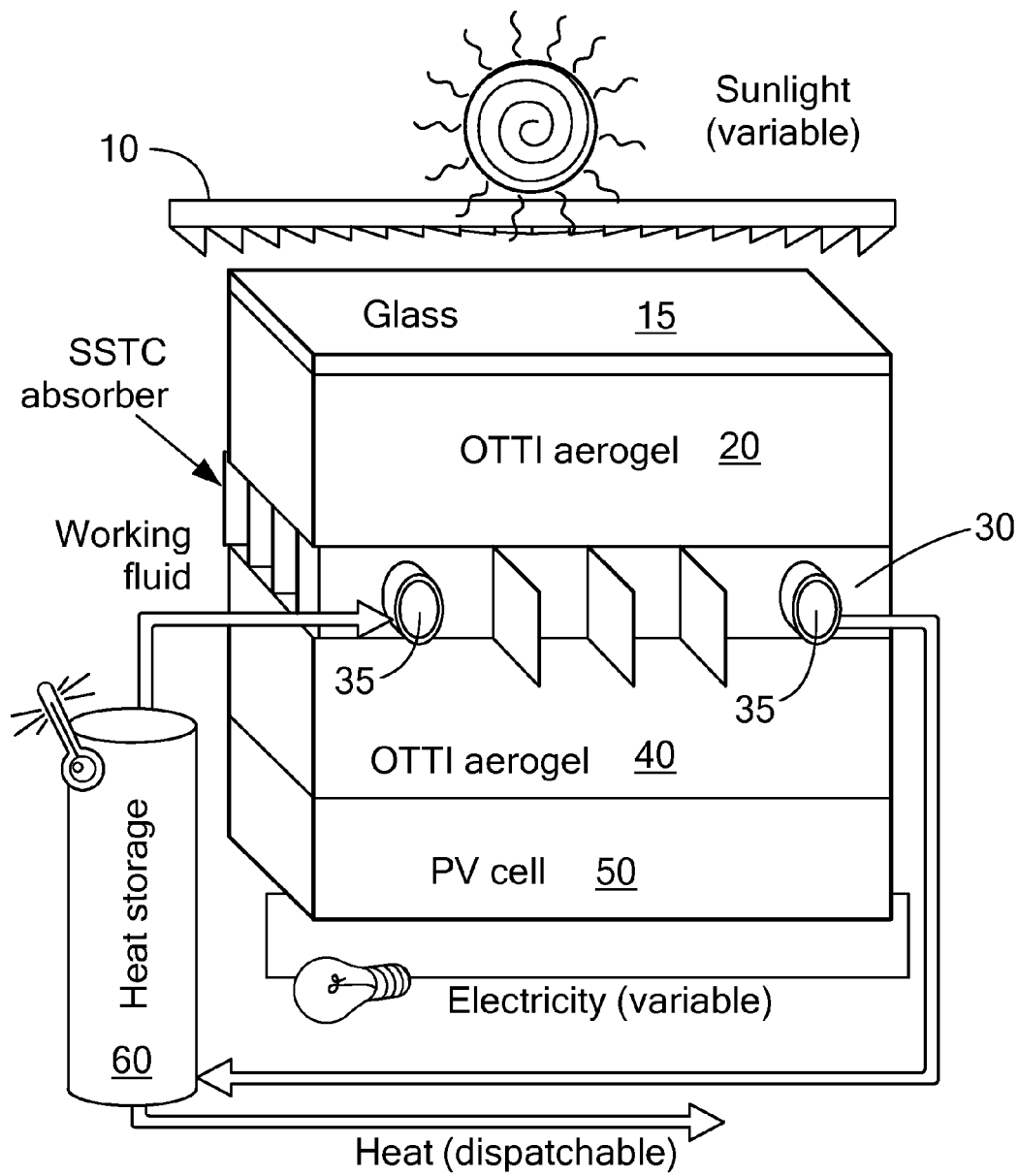
FIG. 1 shows a single-stack solar receiver in an embodiment of the invention.

FIG. 1 shows schematically a solar power receiver stack 1 according to an embodiment of the invention. The stack 1 includes, from top to bottom: an optical concentrator 10, a glass layer for mechanical stability and humidity blocking 15, an aerogel layer that is optically transparent and thermally insulating ("OTTI") 20; a spectrally selective high thermal conductivity ("SSTC") thermal absorber layer 30 in which thermal working fluid is heated; a bottom OTTI aerogel layer 40; and a PV cell layer 50 that generates electricity. The pipes 35 in the SSTC layer carry a heated thermal working fluid to transfer heat energy to a heat storage or conversion device 60 external to the receiver stack. The details of the solar power receiver stack's layers in embodiments of the invention are presented below.

Optically Transparent and Thermal Insulating ("OTTI") Layer.

In a preferred embodiment of the invention, the OTTI layers (20, 40) are silica aerogels. In other embodiments, other aerogels may be used. Silica aerogels have an intrinsic spectral selectivity that allows them to pass most of the solar radiation yet trap infrared (IR) radiation. Intrinsic silica aerogels are good insulators, with a room-temperature thermal conductivity less than 0.02 W/m/k. Such aerogels also can be more than 90% transparent in the visible spectrum. The aerogel traps thermal emission from the hot surface of the SSTC and conducts it back to the SSTC. Thus, this top OTTI layer serves to reduce the radiation and convection heat losses from the internally hot SSTC region to the ambient. In a specific embodiment of the invention, the top aerogel layer may be about one cm thick.

In some preferred embodiments of the invention, the top OTTI layer includes an aerogel that is substantially transparent in the band from 0.3 μm to 1.8 μm and substantially insulating in the band greater than 2.5 μm. Substantially transparent shall mean with a solar weighted transmittance>80 percent over the 0.3 μm to 1.8 μm band and substantially insulating shall mean with a transmittance<20 percent for the band greater than 2.5 μm for the weighted spectrum of a black body at 400 C. The bottom OTTI layer may include an aerogel with similar properties.

In other embodiments, improved aerogels in the OTTI layers may be used to increase the receiver efficiency and potentially reduce solar concentration requirements. Silica aerogels are transmissive at short wavelengths because there are no absorption modes for silica at these wavelengths. However, Rayleigh scattering, which is a function of aerogel pore size, reduces the transmission for short wavelengths. By varying the pH during the aerogel synthesis process, and/or the drying time during the drying process, the pore size and Rayleigh scattering can be controlled. Although silica aerogels are naturally strongly absorbing from 5-30 μm, absorption from 3-5 μm can be further increased through the addition of water or other dopants (e.g., carbon-based dopants) into the aerogel. The thermal conductivity of aerogels also depends strongly on the structures, which should be optimized in conjunction with optical properties.

Aerogel synthesis is well known and established processing steps can be used to synthesize the OTTI layer. In a specific embodiment of the invention, a procedure for synthesizing wet silica gels by the sol-gel polymerization of tetramethyl orthosilicate (TMOS) is followed. Because hydrolysis of TMOS is much faster than that of tetraethyl orthosilicate (TEOS), $NH_3$ is used as a condensation catalyst rather than HCl as a hydrolysis catalyst. TMOS is diluted by methanol (MeOH) followed by adding $NH_3$ and water. One possible mixing mole ratio of chemicals is $NH_3$:TMOS:water:methanol=0.07:1:4:6. Then, the sol is gelled in a disposal vial. After 1 week, the lid of the sol-gel mold is removed followed by adding ethanol. For the hydrophobic treatment, the aged gel is removed from the mold and transferred into a stainless steel punched tray in the same ethanol. The hydrophobic reagent (e.g., hexamethyldisilazane (($CH_3$)3Si)2NH) is added in the ethanol and its ratio to the ethanol may be 1:9. The aged gel is kept in the solution at room temperature. After 3 days, the solvent is replaced with ethanol (EtOH) to be prepared for critical point drying (CPD) process because EtOH is miscible with liquid $CO_2$. This procedure can be modified to tune the parameters of the resulting aerogels.

Figure 2:
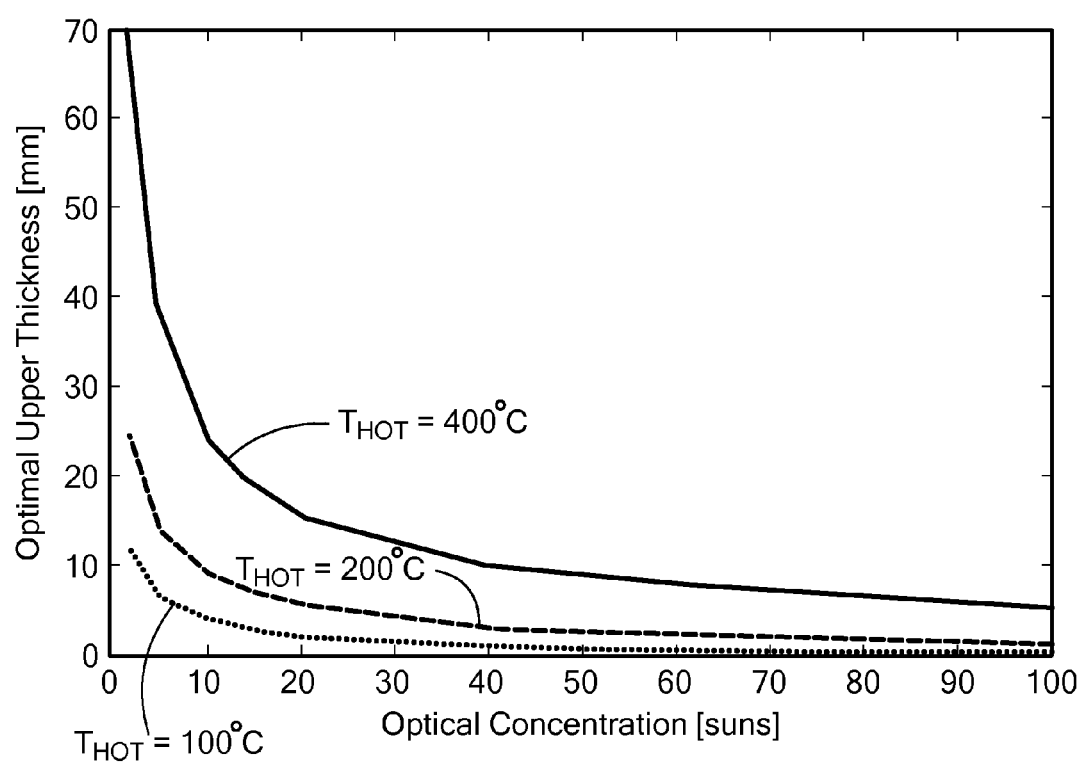
FIG. 2 shows an example of optimizing the front-side aerogel layer thickness in the embodiment of FIG. 1.

The OTTI layer thickness can be determined by balancing two concerns: while thicker aerogel layers are better insulators, thicker aerogels also let less solar radiation through the OTTI layer, which is detrimental to the system performance. Thus, the thickness of the OTTI layer should be determined for the specific application, given the optical and thermal properties of the aerogel itself. In general, for each application the operating temperatures and amount of solar radiation received must be known to calculate the optimal aerogel thickness. Another consideration is the cost and manufacturability of the aerogels. Very thick aerogels, while possibly beneficial in theory, may be undesirable for real applications due to cost or manufacturing considerations. In general, higher SSTC layer temperatures call for thicker aerogels, and higher solar concentration calls for thinner aerogels. Since higher temperatures and higher solar radiation concentrations often go hand in hand, detailed thickness optimization should be performed. An example of optimizing the front-side aerogel thickness is shown in FIG. 2. (Note: $T_{hot}$ is the temperature of the SSTC layer.) In general, useful OTTI layers can be as thin as a millimeter or a few millimeters or as thick as eight to ten centimeters (although the cost frequently makes this upper limit much lower). In some embodiments, the preferred front-side (sun-facing) aerogel thickness will be less than the back-side aerogel thickness.

In some embodiments, internally hot, externally cold structures can be made by adding absorbing particles into the inner region of the aerogel, or within a separate volumetric absorbing region between the OTTI layer and the SSTC layer to further improve aerogel radiative insulation characteristics in the far infrared part of the spectrum. The particles are highly transparent in the visible and near-IR part of the spectrum, and highly absorbing in the far-infrared part of the spectrum. These may include doped indium tin oxide, aluminum-doped zinc oxide or other materials with appropriate absorption characteristics. Doping can improve the thermal insulation properties of aerogels as the energy loss through radiative channels—which can be captured via nanoparticle absorption—constitutes a significant portion of the overall thermal losses.

Spectrally Selective High Thermal Conductivity ("SSTC") Absorption Layer.

Figure 3A:
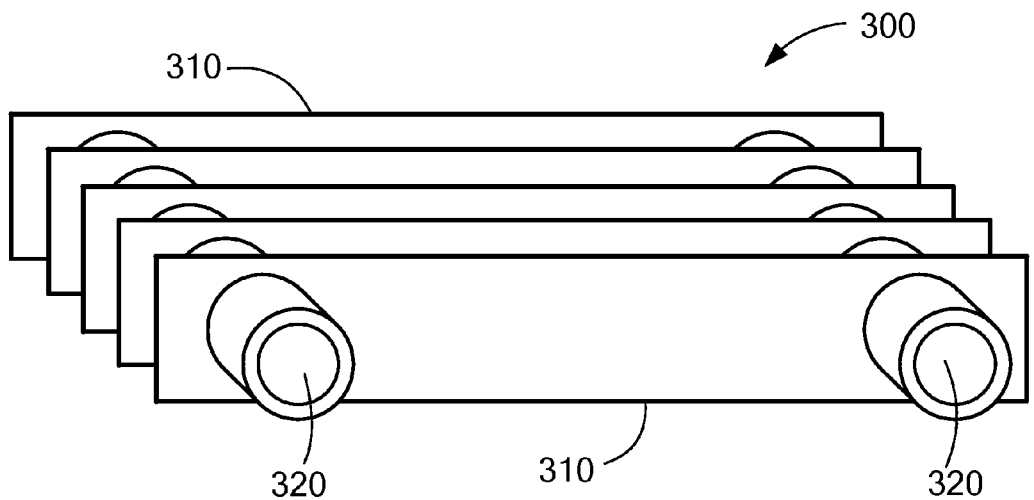
Figure 3B:
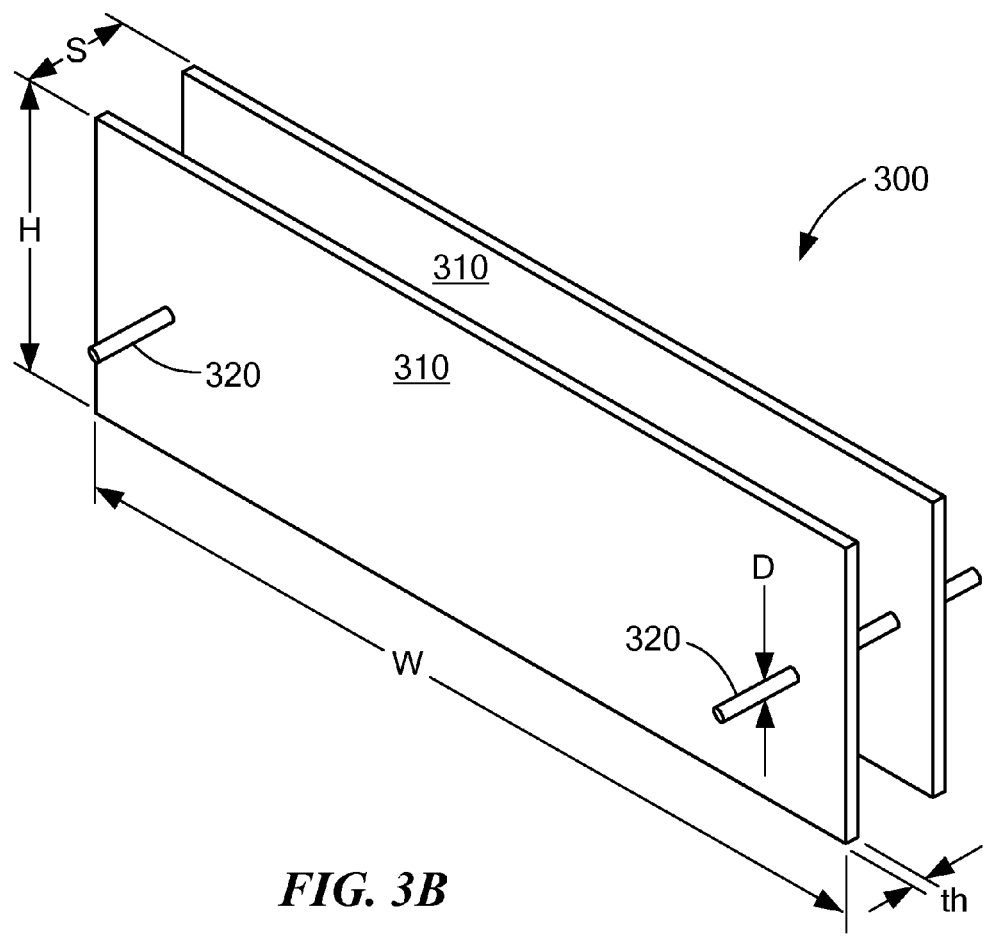
Figure 3C:
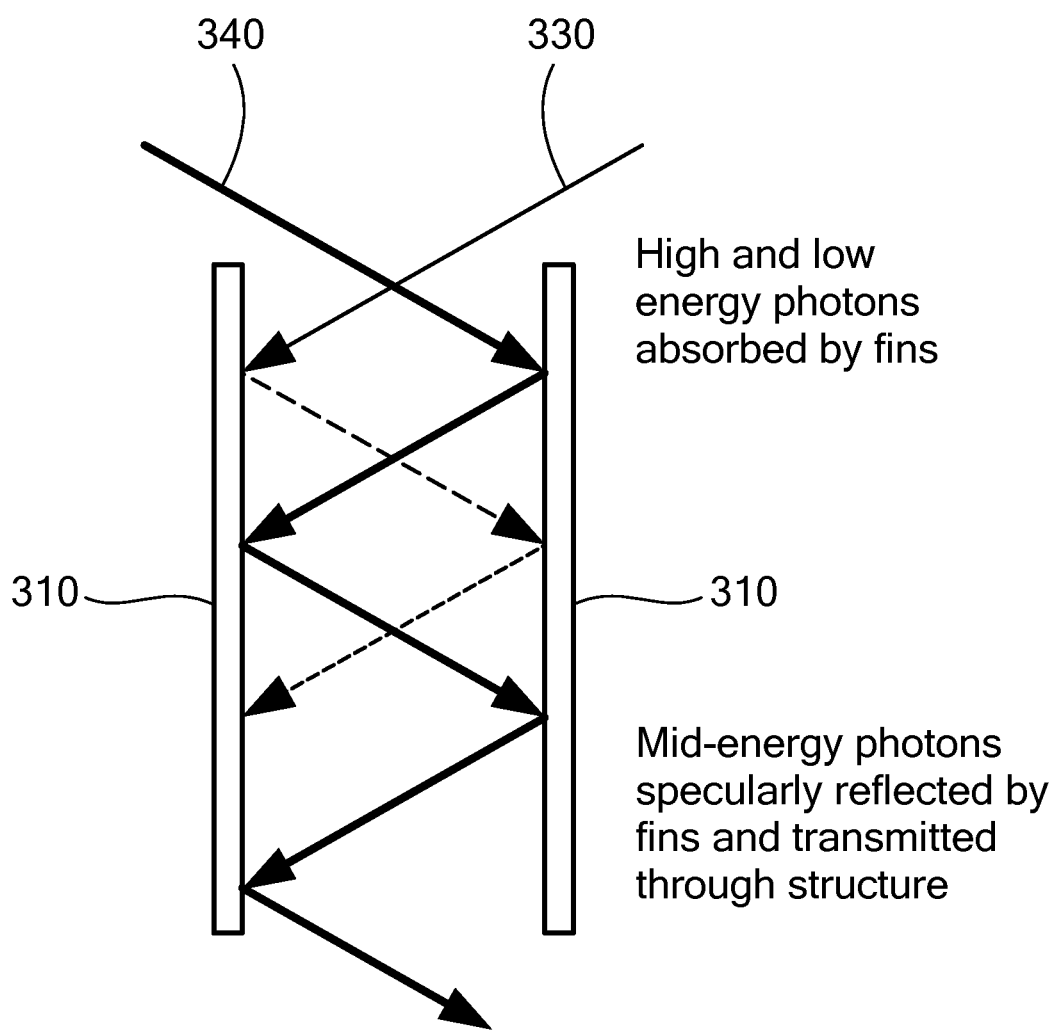
FIG. 3C shows solar radiation absorbed or reflected by the fin structure.

In a preferred embodiment of the invention, as shown in FIGS. 3A-3B, metallic fins joined by metal pipes 300 are used as the structure of the SSTC layer 30. The metallic fins 310 can be coated with a thin film band-block filter to allow photons with energies in a narrow range (e.g., just above the PV cell band gap) to be reflected through the fin structure in order to reach the PV cells. For example, for a stack with a silicon-based PV cell, a band block filter that decreases photon absorption in the band from 750 to 1100 nm can be used. The spectral width of the energy band of photons reflected by the fins may be different in different embodiments to control which portion of the solar energy is directed to the PV cell and which is harnessed as heat. Both the low-energy cutoff and the spectral width of this band will also depend on the type of PV cell used in a particular embodiment of the invention. For example, indirect-bandgap PV cell materials may require wider bands (with the high-energy cut-off potentially as high as the highest energy of solar photons) and/or bands with low-energy cut-offs above the PV material bandgap to compensate for the low absorption close to the bandgap. In specific embodiments, these photons are specularly reflected through the fin structure in order to reach the PV cells. Photons with energies outside of this range will be absorbed by the base metal of the fin, directly or with an engineered absorbing layer. FIG. 3C shows radiation rays 340 in the band block range being specularly reflected by the fins to subsequent layers in the stack, while rays 330 outside the range are absorbed by the fins. Note that the heat absorber fins can be tilted in some embodiments of the invention at an angle to the vertical direction (axis of the stack). Heat generated in the fins 310 will be conducted to pipes 320 that are filled with a thermal working fluid (e.g., Therminol VP-1 or similar). Metallic structures are chosen to allow heat to conduct across the fin with little temperature drop and to withstand the fluid pressures. The number of fins and pipes can be chosen to meet system design parameters.

In some preferred embodiments, for a stack with a silicon-based PV cell, the band block filter decreases photon absorption in a given band where the endpoints of the given band are chosen from the range from 500 nm to 800 nm at the high energy end and from the range from 900 nm to 1100 nm at the low energy end.

In other preferred embodiments, for a receiver stack with a Gallium Arsenide ("GaAs") or a Cadmium Telluride ("CdTe") PV cell for example, the band block filter decreases photon absorption in a given band where the endpoints of the given band are chosen from the range from 300 nm to 700 nm at the high energy end and from the range from 800 nm to 900 nm at the low energy end.

In embodiments of the invention, the metallic surfaces of the fins 310, 420 may be coated with thin film coatings to create a band-block filter that reflects only a select portion of the solar spectrum with photon energies just above the PV cell bandgap. Considering the requirement of very low absorption in the pass band, all-dielectric interference filters may be used. Such filters are made of multiple alternating low-index/high index thin films, which can effectively reflect light in the selected range due to the constructive interference of the reflected waves at each interface. In a specific embodiment, the filter may comprise alternating layers of $SiO_2$ and $TiO_2$ with each layer's thickness on the order of a quarter wavelength.

Figure 4:
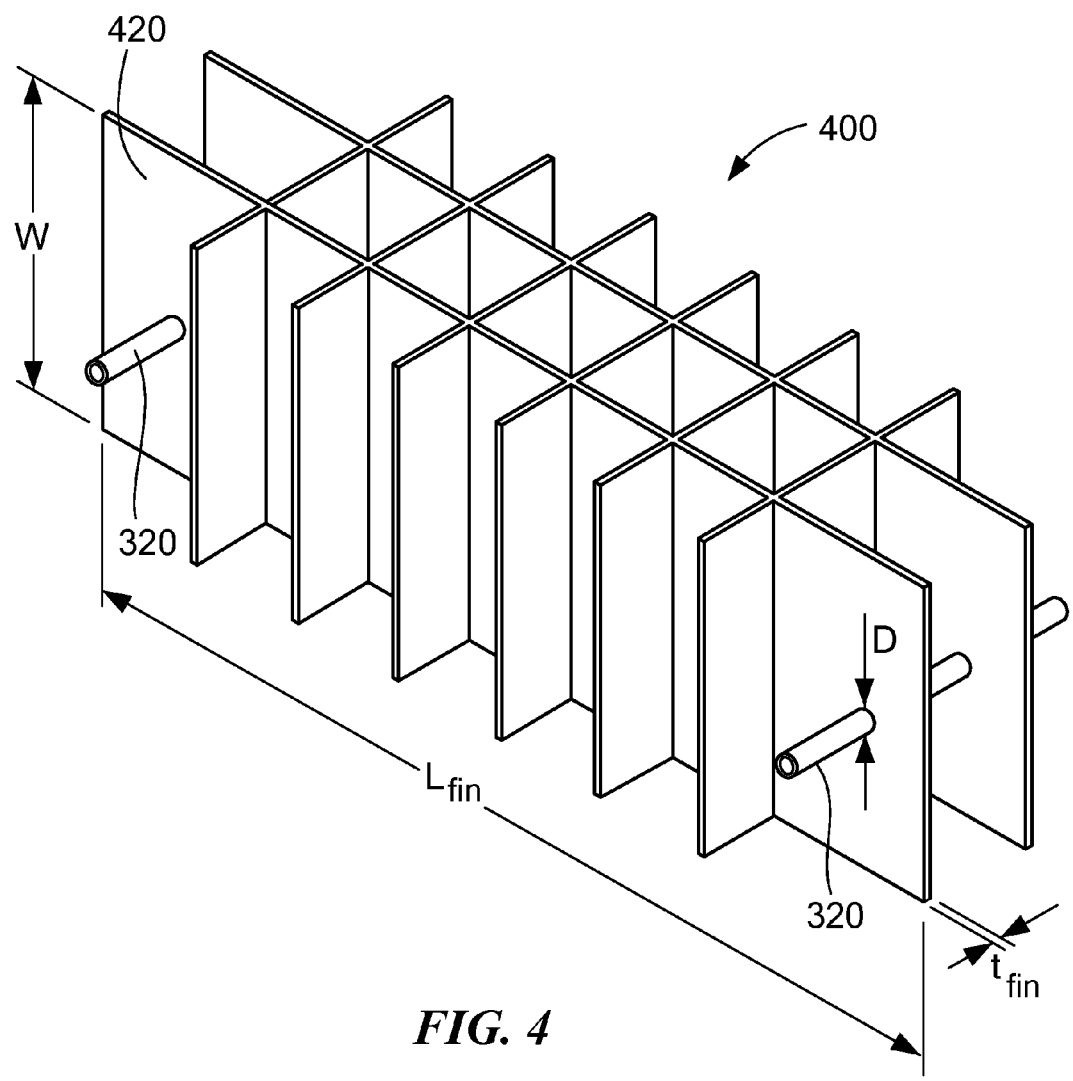
FIG. 4 shows a fin grid structure for the SSTC layer of the embodiment of FIG. 1.

In specific embodiments of the invention, the fins may be arranged in parallel 300 (FIGS. 3A-3B), as a grid 400 (FIG. 4) or as a honeycomb. Other arrangements of fins may also be used.

The dimensions of the SSTC structure may vary in order to optimize the overall performance and minimize cost depending on the heat transfer fluid, the optical concentration, the properties of the selective coating, the exact nature of the incoming concentrated sunlight, the performance of the other components, etc. Nevertheless, the goal of the SSTC remains the same regardless of the exact dimensions and that is to transmit a useful portion of the solar spectrum to the PV cell while absorbing (thermalizing) the rest of the spectrum. The absorbed spectrum is then collected as heat via the thermal working fluid. In specific embodiments of the invention, the SSTC structure shown in FIGS. 3A-B may be constructed according to the range of dimensions shown in the following table.

| Parameter | Value/Relation |
|---|---|
| Diameter, D | 0.5-5 cm |
| Aspect Ratio, AR | 1-5 |
| Fin Thickness, th | 0.03-0.75 cm |
| Pipe Spacing, w | ≈10 D; (>5 D) |
| Fin spacing, S | ≈10 t; (>5 t) |
| Height, H | S · AR; (>D) |
| Total Collector Length | $10-10^3$ m |
| # of Fins | L/S |

With the parallel fin geometry, as shown in FIG. 3B, the SSTC receiver is very similar in design to existing heat sinks, except that the fins have a spectrally selective coating. In some embodiments, thin aluminum sheet metal can be used as the fin structure, providing reasonable thermal conductivity and low cost. The aluminum surfaces will be coated to provide the spectral selectivity as described above. Copper tubing can be fed through pre-cut holes in the fin sheets to assemble the fin array. The connection can be ensured through press-fitting the copper tubing through the holes. Soldering or brazing can then be applied for improved thermal contact between the two pieces. In other embodiments, other metals maybe used for the fin structures and tubing. Once this array is assembled, a layer of aerogel material in its gel form is placed above and below. To ensure conformance of the aerogel layers, the entire piece (including fins and pipes) can be placed in a large scale critical point dryer in order to create the final aerogel. The dried layers can then be sandwiched between a layer of glass 15 (top) and PV cell 50 (bottom) which are fixed to a rigid housing. Two procedures that can be used for applying the film coating to the fins include: (1) assembling the structure (working fluid pipes through the fins) and then applying the coating on the fabricated structure, and (2) applying the coating to the fins, and then assembling the fins and pipes into the final structure. In specific embodiments, one side of the fin may be coated with an ultraviolet ("UV") absorbing layer and the other side of the fin with an infrared ("IR") absorbing layer. In other embodiments of the invention, metals other than aluminum, such as copper, steel, etc., may be used for the fins.

Bottom Optically Transparent and Thermal Insulating (OTTI) Layer.

In various embodiments of the invention, the same design and fabrication principles for the top OTTI layer 20 can apply to the bottom OTTI layer 40. However, the top and bottom OTTI layers need not be identical. In a specific embodiment of the invention, the bottom OTTI layer may be about 1 mm thick, while the top OTTI layer may be about 3.5 mm thick.

Photovoltaic Cell Layer.

In preferred embodiments of the invention, silicon PV cells can be used as the photovoltaic cell layer 50 of the receiver stack 1. Silicon PV cells are readily available as off the shelf components. In other embodiments, other types of PV cells as are known in the art, such as Gallium Arsenide, Cadmium Telluride or organic PV cells may be used as the PV cell layer.

Optical Concentrator.

Figure 5:
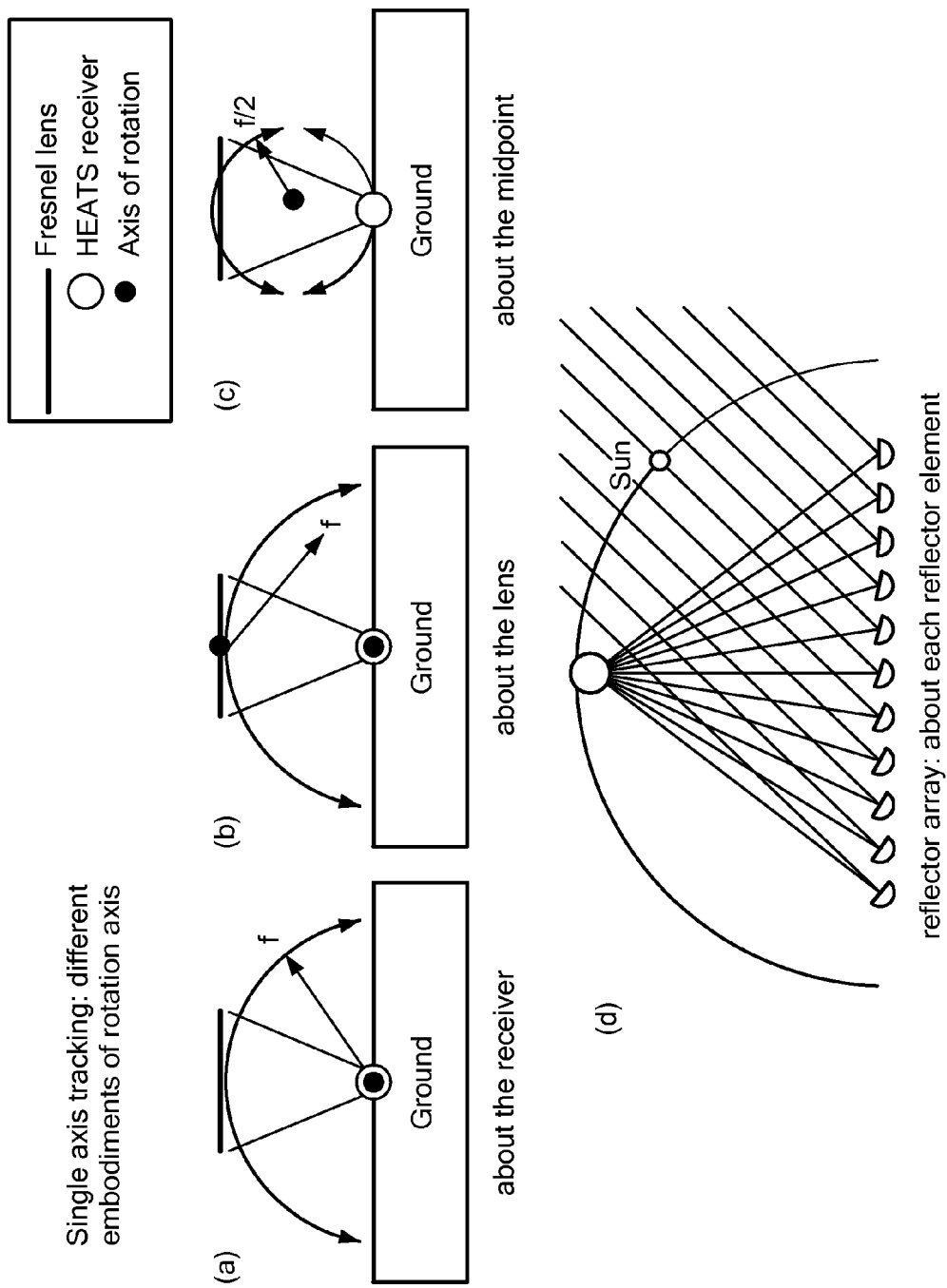
FIG. 5 shows an optical concentrator that may be used in the embodiment of FIG. 1.

In various embodiments of the invention, the solar receiver may be provided with an optical concentrator 10. To improve performance, the solar receiver may provide concentration of the solar energy in the range of 5-100 suns as well provide a sun tracking system. Various embodiments of such tracking systems are shown in FIG. 5 and include: (a) a ground-mounted receiver and a Fresnel lens rotating around the receiver center point, (b) a ground-mounted receiver and a Fresnel lens rotating around the lens center point, (c) a ground-mounted receiver and a Fresnel lens rotating around the system midpoint, and (d) an elevated receiver and a ground-mounted linear Fresnel lens concentrator (i.e., an array of independently controlled reflector elements). Configuration (d) is a preferred embodiment because this configuration provides: independent control over each reflector element; a fixed axis of rotation for each reflector element; a fixed receiver; fixed heat transfer fluid piping; ability to turn the system "on" or "off"; and ability to clean reflector elements.

While the OTTI, SSTC and PV layers may be adjacent to each other as shown in FIG. 1 in preferred embodiments of the invention, in other embodiments of the invention the OTTI, STTC and PV layers will be stacked in the order shown but may also have an intervening layer between one or more of the OTTI, SSTC and PV layers.

The embodiments of the invention described above are intended to be merely exemplary; numerous variations and modifications will be apparent to those skilled in the art. All such variations and modifications are intended to be within the scope of the present invention as defined in the appended claims.

What is claimed is:

1. A single-stack solar power receiver comprising:
a first aerogel layer, the first aerogel layer including an aerogel that is optically-transparent in the visible and the near-infrared wavelength ranges and thermally-insulating in the mid- and far-IR ranges;
a heat absorption layer, adjacent to the first aerogel layer, comprising a fin structure having at least two metallic fins with opposing surfaces facing each other, the fins configured to decrease energy absorption in a given band, a first endpoint of the given band in a range from 500 nm to 800 nm at a high energy end and a second endpoint of the given band in a range from 900 nm to 1100 nm at a low energy end, wherein the fins are arranged such that radiation in the given band is reflected between the opposing surfaces and the reflected radiation is transmitted through the fin structure to a subsequent layer in the stack, the heat absorption layer further including pipes connected to the fins for carrying a thermal fluid;
a second aerogel layer adjacent to the heat absorption layer; and
a photovoltaic cell layer adjacent to the second aerogel layer.

2. The single-stack solar power receiver according to claim 1, wherein the given band is from 750 nm to 1100 nm.

3. The single-stack solar power receiver according to claim 1, further including an optical concentrator that is located between a source of solar radiation and the first aerogel layer.

4. The single-stack solar power receiver according to claim 1, wherein the fins are connected as a set of parallel fins.

5. The single-stack solar power receiver according to claim 1, wherein the fins are connected as a grid of fins.

6. The single-stack solar power receiver according to claim 1, wherein the fins are tilted at an angle to an axis of the stack.

7. The single-stack solar power receiver according to claim 1, wherein the fins are coated with a film that decreases the energy absorption in the given band.

8. The single-stack solar power receiver according to claim 7, wherein the film coating the fins is a composite film comprising dielectric layers.

9. The single-stack solar power receiver according to claim 1, further including a heat storage device connected to the pipes that are connected to the fins.

10. The single-stack solar power receiver according to claim 1, further including a heat energy conversion device connected to the pipes that are connected to the fins.

11. The single-stack solar power receiver according to claim 1, wherein the second aerogel layer includes an aerogel that is optically-transparent in the visible and the near-infrared wavelength ranges and thermally-insulating in the mid- and far-IR ranges.

12. A single-stack solar power receiver comprising:
a first aerogel layer, the first aerogel layer including an aerogel that is optically-transparent in the visible and the near-infrared wavelength ranges and thermally-insulating in the mid- and far-IR ranges;
a heat absorption layer, adjacent to the first aerogel layer, comprising at least two metallic fins, the fins configured to decrease energy absorption in a given band, a first endpoint of the given band in a range from 500 nm to 800 nm at a high energy end and a second endpoint of the given band in a range from 900 nm to 1100 nm at a low energy end, wherein the fins are arranged such that radiation in the given band is reflected from and the reflected radiation is transmitted to a subsequent layer in the stack, the heat absorption layer further including pipes connected to the fins for carrying a thermal fluid, wherein the fins are coated with a composite film comprising dielectric layers and metal layers that decrease the energy absorption in the given band;
a second aerogel layer adjacent to the heat absorption layer; and
a photovoltaic cell layer adjacent to the second aerogel layer.

13. A single-stack solar power receiver comprising:
a first aerogel layer, the first aerogel layer substantially transparent in a first band from 0.3 µm to 1.8 µm and substantially insulating in a second band greater than 2.5 µm;
a heat absorption layer, adjacent to the first aerogel layer, comprising a fin structure having at least two metallic fins with opposing surfaces facing each other, the fins configured to decrease energy absorption in a given band, a first endpoint of the given band in a range from 500 nm to 800 nm at a high energy end and a second endpoint of the given band in a range from 900 nm to 1100 nm at a low energy end, wherein the fins are arranged such that radiation in the given band is reflected between the opposing surfaces and the reflected radiation is transmitted through the fin structure to a subsequent layer in the stack, the heat absorption layer further including pipes connected to the fins for carrying a thermal fluid;
a second aerogel layer adjacent to the heat absorption layer; and
a photovoltaic cell layer adjacent to the second aerogel layer.

14. The single-stack solar power receiver according to claim 13, wherein the given band is from 750 nm to 1100 nm.

15. The single-stack solar power receiver according to claim 13, further including an optical concentrator that is located between a source of solar radiation and the first aerogel layer.

16. The single-stack solar power receiver according to claim 13, wherein the fins are connected as a set of parallel fins.

17. The single-stack solar power receiver according to claim 13, wherein the fins are coated with a film that decreases the energy absorption.

18. The single-stack solar power receiver according to claim 13, further including a heat storage device connected to the pipes that are connected to the fins.

19. The single-stack solar power receiver according to claim 13, further including a heat energy conversion device connected to the pipes that are connected to the fins.

20. A single-stack solar power receiver comprising:
a first aerogel layer, the first aerogel layer including an aerogel that is optically-transparent in the visible and the near-infrared wavelength ranges and thermally-insulating in the mid- and far-IR ranges;
a heat absorption layer, adjacent to the first aerogel layer, comprising a fin structure having at least two metallic fins with opposing surfaces facing each other, the fins configured to decrease energy absorption in a given band, a first endpoint of the given band in a range from 300 nm to 700 nm at a high energy end and a second endpoint of the given band in a range from 800 nm to 900 nm at a low energy end, wherein the fins are arranged such that radiation in the given band is reflected between the opposing surfaces and the reflected radiation is transmitted through the fin structure to a subsequent layer in the stack, the heat absorption layer further including pipes connected to the fins for carrying a thermal fluid;
a second aerogel layer adjacent to the heat absorption layer; and
a photovoltaic cell layer adjacent to the second aerogel layer.

* * * * *